United States Patent
Chen et al.

(10) Patent No.: US 9,605,340 B2
(45) Date of Patent: Mar. 28, 2017

(54) METHOD TO PRODUCE HIGHLY TRANSPARENT HYDROGENATED CARBON PROTECTIVE COATING FOR TRANSPARENT SUBSTRATES

(71) Applicant: Intevac, Inc., Santa Clara, CA (US)

(72) Inventors: David Fang Wei Chen, San Jose, CA (US); David Ward Brown, Pleasanton, CA (US); Charles Liu, Los Altos, CA (US); Samuel D. Harkness, IV, Berkeley, CA (US)

(73) Assignee: INTEVAC, INC., Santa Clara, CA (US)

( * ) Notice: Subject to any disclaimer, the term of this patent is extended or adjusted under 35 U.S.C. 154(b) by 561 days.

(21) Appl. No.: 13/935,993

(22) Filed: Jul. 5, 2013

(65) Prior Publication Data
US 2014/0008214 A1  Jan. 9, 2014

Related U.S. Application Data

(60) Provisional application No. 61/668,402, filed on Jul. 5, 2012.

(51) Int. Cl.
*C23C 14/35* (2006.01)
*C23C 14/34* (2006.01)
(Continued)

(52) U.S. Cl.
CPC ...... *C23C 14/3464* (2013.01); *C23C 14/0057* (2013.01); *C23C 14/0605* (2013.01); *C23C 14/562* (2013.01); *C23C 14/35* (2013.01)

(58) Field of Classification Search
CPC .................................................. C23C 14/0605
See application file for complete search history.

(56) References Cited

U.S. PATENT DOCUMENTS 4,690,744 A   9/1987 Naoe et al.
5,045,165 A   9/1991 Yamashita
(Continued)

FOREIGN PATENT DOCUMENTS

CN    1782123 A   6/2006
CN    201261804 Y   6/2009
(Continued)

OTHER PUBLICATIONS

Office Action in U.S. Appl. No. 13/093,775 dated Dec. 3, 2012.
(Continued)

*Primary Examiner* — Keith Hendricks
*Assistant Examiner* — Timon Wanga
(74) *Attorney, Agent, or Firm* — Nixon Peabody LLP

(57) ABSTRACT

A physical vapor deposition (PVD) chamber for depositing a transparent and clear hydrogenated carbon, e.g., hydrogenated diamond-like carbon, film. A chamber body is configured for maintaining vacuum condition therein, the chamber body having an aperture on its sidewall. A plasma cage having an orifice is attached to the sidewall, such that the orifice overlaps the aperture. Two sputtering targets are situated on cathodes inside the plasma cage and are oriented opposite each other and configured to sustain plasma therebetween and confined inside the plasma cage. The plasma inside the cage sputters material from the targets, which then passes through the orifice and aperture and lands on the substrate. The substrate is moved continuously in a pass-by fashion during the process.

13 Claims, 2 Drawing Sheets

(51) Int. Cl.
*C23C 14/00* (2006.01)
*C23C 14/06* (2006.01)
*C23C 14/56* (2006.01)

(56) References Cited

U.S. PATENT DOCUMENTS

| | | | |
|---|---|---|---|
| 5,135,808 | A | 8/1992 | Kimock et al. |
| 5,268,217 | A * | 12/1993 | Kimock ............... B32B 17/06 |
| | | | 428/216 |
| 5,286,296 | A | 2/1994 | Sato et al. |
| 5,399,252 | A | 3/1995 | Scherer et al. |
| 5,415,753 | A | 5/1995 | Hurwitt et al. |
| 5,527,596 | A | 6/1996 | Kimock et al. |
| 5,556,519 | A | 9/1996 | Teer |
| 5,584,973 | A | 12/1996 | Wada et al. |
| 5,609,739 | A | 3/1997 | Aokura et al. |
| 5,728,276 | A | 3/1998 | Katsuki et al. |
| 5,830,327 | A | 11/1998 | Kolenkow |
| 5,830,332 | A | 11/1998 | Babich et al. |
| 5,858,182 | A * | 1/1999 | Horng ............... C23C 14/0605 |
| | | | 204/192.15 |
| 5,891,311 | A | 4/1999 | Lewis et al. |
| 6,156,172 | A | 12/2000 | Kadokura |
| 6,562,715 | B1 * | 5/2003 | Chen ............... C23C 16/34 |
| | | | 204/192.17 |
| 6,572,738 | B1 | 6/2003 | Zueger |
| 6,572,935 | B1 | 6/2003 | He et al. |
| 6,689,253 | B1 | 2/2004 | Koh et al. |
| 6,902,646 | B2 | 6/2005 | Mahoney et al. |
| 7,632,538 | B2 | 12/2009 | Veerasamy |
| 2003/0124846 | A1 | 7/2003 | Chiang et al. |
| 2004/0045811 | A1 | 3/2004 | Wang et al. |
| 2008/0014466 | A1 | 1/2008 | Wei et al. |
| 2008/0202924 | A1 | 8/2008 | Bluck et al. |
| 2008/0210546 | A1 | 9/2008 | Ukishima et al. |
| 2010/0006429 | A1 * | 1/2010 | Fukada ............... C23C 14/225 |
| | | | 204/298.11 |
| 2010/0072061 | A1 | 3/2010 | Morohashi |
| 2010/0078309 | A1 * | 4/2010 | Ueda ............... C23C 14/352 |
| | | | 204/192.1 |
| 2010/0200393 | A1 | 8/2010 | Chow et al. |
| 2010/0230274 | A1 | 9/2010 | Greene et al. |
| 2012/0097525 | A1 | 4/2012 | Harkness et al. |
| 2012/0152726 | A1 * | 6/2012 | Harkness, IV ........ C23C 14/352 |
| | | | 204/192.12 |
| 2014/0102888 | A1 | 4/2014 | Harkness et al. |

FOREIGN PATENT DOCUMENTS

| | | |
|---|---|---|
| CN | 101602273 A | 12/2009 |
| CN | 104603324 A | 5/2015 |
| JP | 01-160815 A | 6/1989 |
| JP | 2015-528056 A | 9/2015 |
| KR | 10-2015-0030741 A | 3/2015 |
| TW | 201226612 A | 7/2012 |
| TW | 201410902 A | 3/2014 |
| WO | 2008/090982 A1 | 7/2008 |
| WO | 2012/082279 A1 | 6/2012 |
| WO | 2014/008484 A2 | 1/2014 |
| WO | 2015/051277 A2 | 4/2015 |

OTHER PUBLICATIONS

Office Action in U.S. Appl. No. 13/094,779 dated Jun. 3, 2013.
Office Action in U.S. Appl. No. 14/046,720 dated Dec. 5, 2014.
International Search Report and Written Opinion in PCT Application No. PCT/US11/60387, mailed Mar. 26, 2012.
International Preliminary Report on Patentability in PCT Application No. PCT/US11/60387, mailed Jun. 27, 2013.
Office Action and Search Report in Taiwanese Patent Application No. 100141391 dated May 12, 2014.
International Search Report and Written Opinion in PCT Application No. PCT/US2014/059105, mailed Dec. 17, 2014.
International Search Report and Written Opinion in PCT/US2013/049467, mailed on Dec. 17, 2013.
International Preliminary Report on Patentability in PCT Application No. PCT/US2013/049467, mailed Jan. 15, 2015.
Office Action and Search Report in Taiwanese Patent Application No. 102124269 dated Mar. 10, 2015.
Belkind, A. et al., "Dual-anode magnetron sputtering", Surface and Coatings Technology, 2003, vol. 163-164, pp. 695-702.
Iljinas, A. et al., "Thin Ferromagnetic Films Deposition by Facing Target Sputtering Method", Nonlinear Analysis: Modeling and Control, 2005, vol. 10, No. 1, pp. 57-64.
Komatsu, E. et al., "Support for Silicon Nano-foundry and Nanotechnologies Utilizing Extremely-high Vacuum Technology; Film Deposition Using a Magenetic-flux Distribution Variable Facing-target Sputtering System", Nanotech Japan Bulletin, vol. 4, Issue 5, Oct. 21, 2011, Focus 26-24, 17 pages.
Lee, C.S. et al., J. Appl. Phys. vol. 95, Issue 9, May 1, 2004, pp. 4829-4832.
Lifshitz, Y., Chapter 9.3 "Growth of a-C films using energetic species", Jan. 2002: Silva, S.R.P. Editor, "Properties of Amorphous Carbon", Datareviews Series, No. 29, IEE, 2003, An INSPEC Publication, pp. 291-298.
Schultz, H. et al., "Pulsed arc deposition of super-hard amorphous carbon films", Appl. Phys. A, 2004 (Published online Nov. 12, 2003), vol. 78, pp. 675-679.
Notice of Allowance for Taiwanese Patent Application No. 100141391 dated Jun. 2, 2015.
Office Action in U.S. Appl. No. 14/046,720 dated Jun. 5, 2015.
Search Report and Written Opinion in Singapore Patent Application No. 11201500038P dated Oct. 22, 2015.
First Office Action for Chinese Patent Application No. 201380046056.4 dated Feb. 24, 2016.
Examination Report in Singapore Patent Application No. 11201500038P dated Jun. 20, 2016.

* cited by examiner

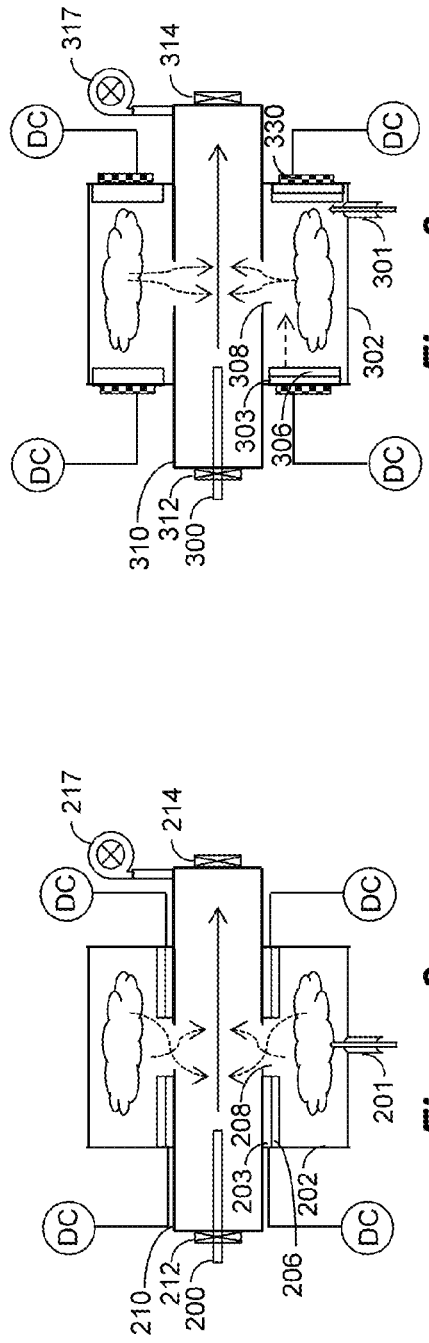

METHOD TO PRODUCE HIGHLY TRANSPARENT HYDROGENATED CARBON PROTECTIVE COATING FOR TRANSPARENT SUBSTRATES

RELATED CASES

This Application claims priority benefit from U.S. Provisional Application, Ser. No. 61/668,402, filed on Jul. 5, 2012.

BACKGROUND

1. Field

This disclosure relates to fabrication of transparent substrates, such as, for example, substrates for flat panel displays and touch screens, and, more specifically, for fabrication of highly transparent protective coatings for such panels.

2. Related Art

With the proliferation of mobile devices having flat screen display and/or touchscreens, the problem of screen scratching becomes problematic. This is especially the case with mobile phones and tablets, which employ touchscreens and are susceptible to scratching. Accordingly, a strong scratch-resistant coating is needed.

Diamond-like coating (DLC) has been suggested as scratch resistant coating for various applications; however, state of the art systems that generate such coating are unable to provide transparent and clear coating. Rather, current coating have slight tint and are not clear. However, users of such devices require clear screen to transmit vivid colors of the image on the screen. Therefore, the yellowing tint of the standard DLC is unacceptable for such applications.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments disclosed herein enable the fabrication of hydrogenated carbon coating, e.g., a diamond-like coating (DLC), which is transparent and clear, meaning it has no perceptible tint. The resulting coating is highly resistive to scratches and is highly transmissive to light, e.g., light emanating from a flat panel display or touchscreen.

According to one embodiment, system and method for providing hydrogenated carbon coating over glass are disclosed. The resulting coating is transparent and is clear without perceptible tint. The coating is generated using physical vapor deposition (PVD) wherein argon and hydrogen gas are injected into the plasma to generate hydrogenated carbon coating.

According to one embodiment, the PVD system is constructed such that there is no or minimal line-of-sight from the target to the coated substrate. The plasma is generated remotely from the substrate, and particles are sputtered from the targets into the plasma zone, without the ability to reach the substrate directly on a line-of-sight approach. Specifically, particles emanating in a trajectory perpendicular to the sputtering surface of the target travel in a direction that is parallel to the direction of travel of the substrate.

According to disclosed embodiments, the PVD is performed without applying any electrical bias to the substrate. In some embodiments only one side of the substrate is coated and in other embodiments both sides are coated simultaneously. The disclosed coating has good adhesion, good clear transmission with no perceptible tint, while providing high resistance to scratching.

According to one embodiment, a physical vapor deposition (PVD) chamber for depositing a transparent and clear hydrogenated carbon film is provided. A chamber body is configured for maintaining vacuum condition therein, the chamber body having an aperture on its sidewall. A plasma cage having an orifice is attached to the sidewall, such that the orifice overlaps the aperture. Two sputtering targets are situated on cathodes inside the plasma cage and are oriented opposite each other and configured to sustain plasma therebetween and confined inside the plasma cage. The plasma inside the cage sputters material from the targets, which then passes through the orifice and aperture and lands on the substrate. The substrate is moved continuously in a pass-by fashion during the process.

According to another embodiment, a method of forming clear hydrogenated carbon film over a substrate is provided, comprising: providing a process chamber and a plasma cage positioned outside the process chamber; affixing amorphous carbon sputtering targets onto two cathodes inside the plasma cage, such that the two sputtering targets face each other; evacuating the process chamber; injecting into the plasma cage process gasses of argon and hydrogen; igniting and sustaining plasma by applying DC power to the two cathodes and confining the plasma inside the plasma cage; transporting the substrate inside the process chamber; providing a path for particles sputtered from the sputtering target to reach the substrate inside the process chamber.

According to yet another embodiment, a system for depositing a clear hydrogenated carbon on a substrate is provided, comprising: an entrance loadlock chamber; a pre-clean chamber attached to the entrance loadlock chamber via an isolation valve; an isolation chamber coupled to the pre-clean chamber; a static sputtering chamber coupled to the isolation chamber and configured for depositing SiO2 film over the substrate; a second isolation chamber coupled to the static sputtering chamber; a pass-by sputtering chamber coupled to the second isolation chamber and configured for depositing hydrogenated carbon film over the SiO2 film; and, an exit loadlock chamber.

BRIEF DESCRIPTION OF THE DRAWINGS

Other aspects and features of the invention would be apparent from the detailed description, which is made with reference to the following drawings. It should be mentioned that the detailed description and the drawings provide various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is an overall schematic of a system for the application of hydrogenated carbon film on a substrate, according to one embodiment;

FIG. 2 is a top-view schematic of a sputtering chamber according to one embodiment;

FIG. 3 is a top view schematic of a sputtering chamber according to another embodiment;

DETAILED DESCRIPTION

Figure 4:
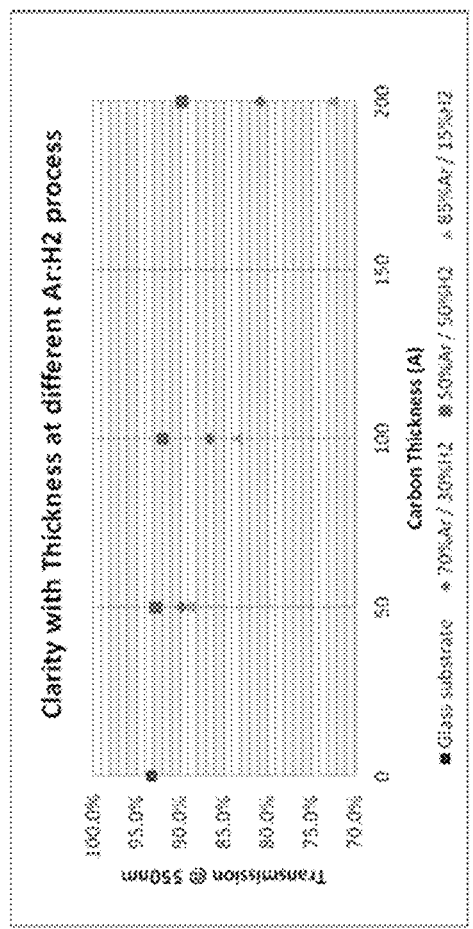
FIG. 4 is a plot of clarity of the glass substrate with a DLC coating using various ratios of argon to hydrogen gas, according to disclosed embodiments.

FIG. 1 illustrates an embodiment of a system for depositing scratch resistant hydrogenated carbon, e.g., hydrogenated DLC coating over glass substrates. In this example, the system has two separate rows of chambers, which may be stacked vertically, e.g., upper and lower rows, or placed side by side horizontally. Employing a vertical architecture enables easy access to both sides of each chamber without increasing the overall footprint of the system. Easy access to both sides of each chamber allows for simultaneous sputtering of both sides of each substrate, if that's needed. If only one side needs to be coated, then horizontal side-by-side architecture can be employed. If the substrates are transported and processed while held in a vertical orientation, then the footprint of the system may not increase dramatically, even for a side-by-side architecture.

Regardless of the architecture, as shown in FIG. 1, the substrates are loaded and unloaded in atmospheric load/unload platform 100. The substrates then enter loadlock vacuum chamber 105. In FIG. 1, "x" marks a location of a vacuum isolation valve. Thus, for example, loadlock vacuum chamber 105 has an isolation valve on both sides, i.e., entrance and exit. When the substrate enters the loadlock, the valves are closed and the loadlock is evacuated, thus introducing the substrate to a vacuum environment. The substrates then exit the loadlock and enter station 1 of process module 1, which is a pre-clean station 110. Station 1 is an inductively coupled plasma chamber and it performs pre-clean of the substrate by generating plasma using argon and oxygen gas. In this chamber, a substrate is stopped in front of the inductively coupled plasma source and plasma cleaning on the substrate is performed. In this sense, this chamber may be referred to as static chamber, since the substrate is held static during processing. From there the substrates are moved in to station 2 of process module 1, which is an isolation chamber 115, isolating the pre-clean chamber from the processing of process module 2.

The substrates are then moved to station 3 of process module 2, which is a PVD chamber 120. PVD chamber 120 is a pass-by PVD chamber, meaning that the substrates are continuously moved and scanned past the target as the deposition process is taking place. In station 3 the substrates are coated with a thin layer of SiO2, using silicon target in the presence of plasma sustained with oxygen and argon gas. The SiO2 layer is of thickness of 10-80 Å, and in some embodiments it is 40-60 ÅA, thus being totally clear and transparent without any tint. The substrates then move to station 4, which is an isolation chamber 125. Thus, in this embodiment, the PVD chamber 120 has an isolation chamber at its entrance and an isolation chamber at its exit, to ensure total isolation of the PVD chamber form the remaining parts of the system.

The substrates are then rotated in rear module 130 and moved into station 5, which is isolation chamber 135. Notably, when the system employs a vertically stacked architecture, station 5 would also incorporate an elevator to raise or lower the substrate to the next row of chambers. The substrate is then moved into station is, which is a PVD chamber for depositing the hydrogenated carbon or hydrogenated DLC film. PVD chamber 140 is a pass-by PVD chamber, meaning that the substrate is moved continuously and is scanned in front of the deposition source during the sputtering process. Thus, the system of FIG. 1 is a mixed system, having a stop and go inductively coupled plasma pre-clean chamber and a pass-by PVD chamber in the same processing line.

At station 6, which is a PVD chamber 140, a hydrogenated DLC layer is deposited over the SiO2 layer, using remotely confined plasma, wherein the sputtering targets have no line of sight to the substrate, such that particles are prevented from flying directly from the target to the substrate. This process is performed at about 1-30 mTorr or, at 7-10 mTorr, using 25-70% hydrogen and 25-80% argon gas. The substrate may be at room temperature, i.e., 25° C., or may be heated due to the prior plasma clean and SiO2 deposition, or otherwise by a heater, up to about 250° C. The DLC coating is about 40-75 A and is completely transparent and clear to the visible spectrum, having no tint. The substrates are then moved to station 7, which is an isolation chamber 145, and from there exit to the load/unload platform via loadlock 150. Thus, PVD chamber 140 also has an isolation chamber at its entrance and one at its exit.

FIGS. 2 and 3 illustrate a top cross-sectional view of embodiments for sputtering systems especially suitable for depositing the hydrogenated DLC coating in station 140. Either one of these two embodiments may be used; however, if total lack of line of sight from target to substrate is sought, then the embodiment of FIG. 3 should be employed. Also, the embodiments of FIGS. 2 and 3 are illustrated with sputtering sources on either side of the processing chamber, enabling simultaneous deposition on both sides of the substrate. However, for substrates that require deposition on only one surface, one of the sources may be omitted, such that the chamber has one sputtering source attached to one sidewall only.

As can be seen in FIG. 2, a processing chamber 210 has an entrance opening with valve 212, and exit opening with valve 214, through which substrates 200 are introduced and removed from the chamber, respectively. The chamber also has opposing sidewall, at least one of which having an aperture 208, to enable particulate to pass there-through and be deposited on the substrate 200 when the substrate is situated within the chamber. The substrate 200 may be stationary or moving, in the direction shown by the arrow, during the deposition process. The processing chamber 210 is configured for maintaining vacuum therein, and is evacuated by vacuum pump 217.

A plasma cage 202 is attached to the sidewall of chamber 210 and has an aperture corresponding to the aperture in the chamber sidewall. The plasma cage 202 confines the plasma to an area remotely from the substrate 200, such that no plasma reaches the substrate 200. Targets 206 are attached to cathodes 203 and are situated inside the plasma cage 202, such that particles sputtered from the targets 206 do not have a line of sight path to the substrate 200, but rather must meander and reach the substrate 206 via window 208, as shown by the dotted-line arrows. Note that the plasma cage 202 of FIG. 2 has its targets 206 positioned in a direction parallel to the path of the substrate 200. In the embodiment illustrated in FIG. 2, DC power is applied to the cathodes to sustain the plasma and sputter material from the targets so as to deposit the sputtered material onto the substrate 200. In other embodiments, an AC or pulsed DC power may be applied to the cathodes.

The processing chamber shown in FIG. 3 is very similar to that of FIG. 2, except that the plasma cage 302 of FIG. 3 has its targets 306 and cathodes 303 positioned such that the sputtering surface of the targets is in a plane perpendicular to the path of the substrate 300. Stated another way, a line that is perpendicular to the sputtering surface of either target, e.g., shown as the broken-line arrow in FIG. 3, would be parallel to the direction of travel of the target, shown as solid-line arrow. However, in the embodiment of FIG. 3 as well, particles sputtered from the targets 306 do not have a line of sight path to the substrate, but must meander and reach the substrate via window 308.

In both embodiments of FIGS. 2 and 3, the plasma is sustained with processing gas injected via injectors 201 and 301, respectively, in this case a mixture of argon and hydrogen gas. The argon gas is used to generate ions that sputter particles from the targets, while the hydrogen is used for hydrogenating the sputtered film. FIG. 4 is a plot of transmission of DLC thickness at different Ar/H2 ratios. Very good results can be seen at 50% Ar 50% H2.

An optional feature illustrated in FIG. 3 is providing magnet arrays 330 behind each of the opposing targets, and wherein the magnetic polarity on one side is opposite the polarity on the other side. Moreover, it has been found that in order to obtain a transparent and clear DLC film, the maximum magnet energy products for the individual magnets must be in the ranges between 200 kJ/m$^3$<BH$_{max}$<425 kJ/m$^3$ and preferably 300 kJ/m$^3$<BH$_{max}$<400 kJ/m$^3$. Additionally, when the targets are arranged as shown in FIG. 3, the separation between the target pairs should be confined to between 30 and 300 mm and preferably between 40 and 200 mm.

Figure 5:
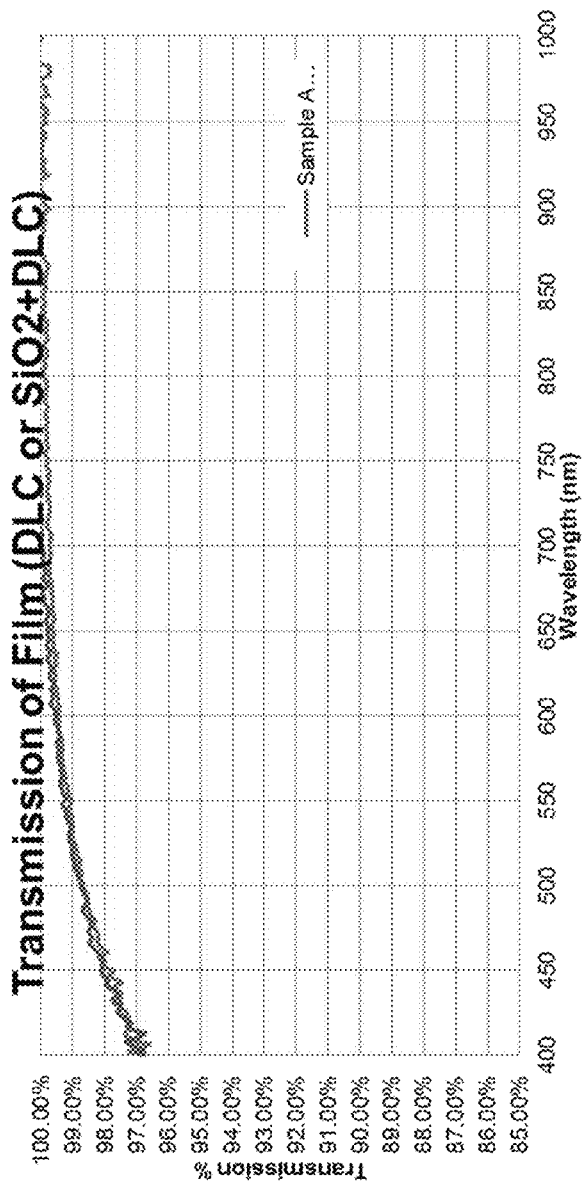
FIG. 5 is a plot of a DLC film and DLC film over SiO2 film, according to disclosed embodiments.

FIG. 5 is a plot of transmission data for both 75 Å DLC and a film of 75 Å DLC deposited over a film of 50 Å SiO2. As can be seen, transmission for both cases is good over all visible frequencies and, is actually improved with the addition of thin SiO2 layer.

To achieve a highly transparent and clear DLC film, the DC power is applied to the target at a specific power density, i.e., power per target area, range. For best results, the power density is about 30-770 kW per square inch of the target. It was discovered that maintaining power density outside this range results in tint or coloration of the film, which is unacceptable for plat screen and touchscreen applications. For example, for a 13 inch target, about 1-4 kW of DC power can be applied to the target, which is 77-308 kW/inch. The DC voltage is 400-1000V, and may be continuous or pulsed. The target material is amorphous carbon, about 90-100% pure carbon. The sputtering gas is generally a H2/Ar mixture with flow of about 50% Ar:50% H2 to 85% Ar:15% H2, wherein a flow of 50% Ar:50% H2 provided the best results, and of 70% Ar:30% H2 provided acceptable, but less desirable results. Other gasses may be added.

In one embodiment, a coating of 75 Å of DLC is deposited using three passes of the substrate in front of a stationary target, each pass depositing 25 Å. The target is DC energized at 2 kW and the substrate is moved at 10 mm/sec during the sputtering process.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method of forming hydrogenated diamond-like carbon (DLC) film over a substrate, comprising:
   providing a process chamber and a plasma cage positioned outside the process chamber;
   affixing carbon sputtering targets onto two cathodes inside the plasma cage, such that the two sputtering targets face each other;
   evacuating the process chamber;
   injecting into the plasma cage process gasses of argon and hydrogen;
   igniting and sustaining plasma by applying power to the two cathodes and confining the plasma inside the plasma cage;
   transporting the substrate inside the process chamber without applying any electrical bias to the substrate; and,
   providing a path for particles sputtered from the sputtering target to reach the substrate inside the process chamber;
   wherein applying power to the two cathodes comprises applying a DC power at power density of about 30-770 W per square inch of the targets so as to form an optically transparent hydrogenated diamond-like carbon film coating that is transparent to visible spectrum and is clear having no perceptible tint.

2. The method of claim 1, wherein applying power to the two cathodes comprises applying DC voltage of 400-1000V.

3. The method of claim 1, wherein applying power to the two cathodes comprises applying DC power of 1-10 kW.

4. The method of claim 1, wherein injecting into the plasma cage process gasses of argon and hydrogen comprises injecting 50% argon and 50% hydrogen.

5. The method of claim 1, wherein injecting into the plasma cage process gasses of argon and hydrogen comprises injecting a mixture of 40%-80% argon and 60%-20% hydrogen.

6. The method of claim 1, further comprising a step of depositing a thin film of SiO2 prior to depositing the hydrogenated carbon film.

7. The method of claim 1, further comprising positioning magnet arrays behind the targets, and setting the magnetic polarity of the magnet array positioned behind one target opposite the polarity of the magnet array positioned behind the opposing target.

8. The method of claim 7, further comprising setting maximum magnet energy products for the individual magnets to from 200 kJ/m$^3$ to 425 kJ/m$^3$.

9. The method of claim 7, further comprising setting maximum magnet energy products for the individual magnets to from 300 kJ/m$^3$ to 400 kJ/m$^3$.

10. The method of claim 1, further comprising setting spatial separation between the targets to from 30 to 300 mm.

11. The method of claim 1, further comprising setting spatial separation between the targets to from 40 to 200 mm.

12. The method of claim 1, further comprising positioning the targets such that there is no line-of-sight from the targets to the substrate.

13. The method of claim 1, comprising positioning the targets such that particles emanating in a trajectory perpendicular to sputtering surface of the targets travel in a direction that is parallel to direction of travel of the substrate.

\* \* \* \* \*